United States Patent [19]
Bai

[11] Patent Number: 5,889,331
[45] Date of Patent: Mar. 30, 1999

[54] SILICIDE FOR ACHIEVING LOW SHEET RESISTANCE ON POLY-SI AND LOW SI CONSUMPTION IN SOURCE/DRAIN

[75] Inventor: Gang Bai, San Jose, Calif.

[73] Assignee: Intel Corporation, Santa Clara, Calif.

[21] Appl. No.: 777,255

[22] Filed: Dec. 31, 1996

[51] Int. Cl.[6] .......................... H01L 23/48; H01L 23/52; H01L 29/40
[52] U.S. Cl. ............................ 257/768; 257/769
[58] Field of Search ................... 257/768, 769, 257/770, 412

[56] References Cited

U.S. PATENT DOCUMENTS

| | | | |
|---|---|---|---|
| 4,485,550 | 12/1984 | Koeneke et al. | 257/412 |
| 4,873,204 | 10/1989 | Wong et al. | 257/770 |
| 4,905,073 | 2/1990 | Chen et al. | 257/770 |
| 5,053,848 | 10/1991 | Houston et al. | 257/770 |

Primary Examiner—Mahshid Saadat
Assistant Examiner—S. V. Clark
Attorney, Agent, or Firm—Blakely, Sokoloff, Taylor & Zafman LLP

[57] ABSTRACT

The invention relates to a process of forming a semiconductor structure. The process includes patterning a conductive layer with a top surface and opposing sides over an area of a semiconductor substrate, depositing a dielectric layer over the conductive layer, and etching the dielectric layer to form spacer portions adjacent the sides of the conductive layer and to expose the top surface and a portion of the conductive layer. The process may be used to form salicides wherein the thickness of the silicide layer of the conductive layer is greater than the thickness of the silicide layer in the diffusion region of a device. The invention also relates to a semiconductor device that includes a conductive layer with opposing side portions over an active area of a semiconductor substrate and a dielectric spacer adjacent to less than the entire portion of a side portion of the conductive layer. The semiconductor device may be used with a salicide process to yield a silicide layer over the conductive layer that is thicker than the silicide layer in the diffusion regions.

3 Claims, 3 Drawing Sheets

SILICIDE FOR ACHIEVING LOW SHEET RESISTANCE ON POLY-SI AND LOW SI CONSUMPTION IN SOURCE/DRAIN

BACKGROUND OF THE INVENTION

1. Field of the Invention

The invention relates to the fabrication of semiconductor devices, including integrated circuits, and more particularly, to a silicide structure and a process for forming silicides.

2. Description of Related Art

As integrated circuit geometries shrink, the forming of discreet devices on a semiconductor substrate becomes more specialized. Specialized deposition and etching techniques permit the density of semiconductor elements on a chip to greatly increase by minimizing the feature size of individual devices. The increased density translates into larger memory, faster operating speeds, and reduced production costs.

A typical metal oxide semiconductor (MOS) transistor generally includes source/drain diffusion regions in a substrate, and a gate electrode formed above the substrate between the diffusion regions and separated from the substrate by a relatively thin dielectric layer or gate oxide. Contact structures can be inserted to the diffusion regions and interlays can overly the contact structures and connect neighboring contact structures. These contact structures to the diffusion region are isolated from the adjacent gate by dielectric spacer or shoulder portions along the side portions of the gate. The dielectric spacer or shoulder portions also isolate the gate from the diffusion region.

FIG. 1 illustrates a planar side portion of a MOS integrated circuit. In FIG. 1, isolation areas or field oxides 160 separate active areas of semiconductor substrate 100. The active area includes a p- or n-type semiconductor substrate 100 underlying a gate 110 consisting of a polycrystalline silicon (polysilicon) line 130 overlying a gate oxide 120. Embedded in the substrate 100 are diffusion regions 150 (i.e., source/drain regions), that are heavily doped with the opposite dopant type of the substrate.

As the feature size of integrated circuits shrink to 0.5 μm or less, the necessity of decreasing the resistance and capacitance associated with interconnection paths becomes more important. The higher the value of the interconnect resistance (R)x capacitance (C) product, the more likely it is the circuit operating speed will be limited by the RC delay. Thus, low resistivity interconnection paths are critical in order to fabricate dense, high performance devices. This is particularly true for MOS devices, in which the RC delay due to the interconnect paths can exceed the delays due to gate switching. Thus, efforts have been made to reduce the resistivity of the interconnect to less than the 15–300 ohm/sq typically exhibited by polysilicon.

The most common approach to reduce the resistivity of the interconnect to less than that exhibited by polysilicon alone is to form a multilayer structure, consisting of a low resistance material, e.g., a refractory metal silicide, on top of a doped polysilicon layer. Such a structure is termed a polycide. The advantages of the polycide gate/interconnect structure to replace polysilicon is that the known work function of polysilicon and the highly reliable polysilicon/$SiO_2$ interface are preserved as polysilicon is still directly on top of the gate oxide.

As the dimensions of a device shrink, the contact resistance of the shallower junctions or diffusion regions also increases. To reduce these resistance values, while simultaneously reducing the interconnect resistance of the polysilicon lines, self-aligned or "silicide" technology is used. Salicide technology involves depositing metal over a MOS structure and reacting exposed silicon areas of the diffusion region as well as exposed polysilicon areas on the gate to form silicides.

A salicide structure is shown in FIGS. 1 and 2. FIG. 1 illustrates a planar side view of a portion of an integrated circuit. FIG. 2 illustrates a planar top view of a portion of the integrated circuit structure of FIG. 1. FIGS. 1 and 2 show active regions containing a silicided gate 110 and silicided diffusion regions 150. The gates 110 are separated from the diffusion regions by spacer portions 140.

The sidewall spacers 140 along the gate are used to prevent the gate 110 and diffusion regions 150 from being electrically connected by avoiding silicide formation on the spacer 140. The sidewall spacers 140 separate the diffusion regions 150 from the gate 110 by only about 500–3,000 Å. Thus, any lateral formation of silicide can easily bridge this separation and cause the gate 110 to be shorted to the diffusion region 150.

The thickness of the silicide layer 135 in the gate 110 and the diffusion region 150 is approximately the same. This is because the thickness of the silicide layer 135 depends on the amount of as-deposited metal that reacts with exposed silicon. The general rule for improved sheet resistance is that the maximum thickness of the silicide layer is equal to one half of the junction depth of the diffusion region 150. Thus, for a diffusion junction 150 with a depth of 1,000 Å, the silicide depth in both the junction 150 and the gate 110 is approximately 500 Å. As the devices become smaller, the line widths become narrower and the junctions become shallower. The shallower junctions limit the thickness of the silicide layer. However, the thickness of the silicide layer is inversely proportional to the sheet resistance. Thus, a thinner silicide layer means more resistance and a longer RC delay (i.e., a slower device).

SUMMARY OF THE INVENTION

A process of forming a semiconductor structure and a semiconductor structure are disclosed. The process includes patterning a conductive layer with a top surface and opposing sides over an active area of a semiconductor substrate, depositing a dielectric layer over the conductive layer, and etching the dielectric layer to form spacer portions adjacent the sides of the conductive layer and to expose the top surface of the conductive layer. The etch of the dielectric layer proceeds so that the spacer portions are recessed to also expose a portion of the sides of the conductive layer. By exposing a portion of the sides of the conductive layer, a thicker layer of silicide may be formed on the conductive layer to lower the resistance of the interconnect line and maintain the thickness of the silicide in the junction at a conventional depth for lowered sheet resistance.

The invention also relates to a semiconductor device that includes a conductive layer with opposing side portions over an active area of a semiconductor substrate and a dielectric spacer adjacent to less than the entire portion of a side portion of the conductive layer. The exposed conductive layer allows a thicker silicide layer to be formed on the conductive layer while maintaining the thickness of the silicide layer in the junction at a conventional depth.

Additional features and benefits of the invention will become apparent from the detailed description, figures, and claims set forth below.

BRIEF DESCRIPTION OF THE DRAWINGS

FIG. 5 illustrates a planar side view portion of an integrated circuit structure wherein a layer of $Si_xN_y$ is deposited over the structure.

FIG. 6 illustrates a planar side view portion of an integrated circuit structure wherein $Si_xN_y$ spacer portions have been formed adjacent polysilicon gates.

FIG. 7 illustrates a planar side view portion of an integrated circuit structure wherein the $Si_xN_y$ spacer portions are recessed to expose a portion of the side portions of the polysilicon gates.

FIG. 8 illustrates a planar side view portion of an integrated circuit structure wherein a layer of metal is deposited over the structure.

FIG. 9 illustrates a planar side view portion of an integrated circuit structure wherein silicide layers have been formed in the source/drain regions and the polysilicon gates.

DETAILED DESCRIPTION OF THE INVENTION

The invention is a semiconductor device and a process for forming a semiconductor device that has a conductive layer with opposing sides over an active area and a dielectric spacer adjacent to less than the entire portion of a side portion of the conductive layer. The device and process for making the device allow for the formation of a thicker silicide layer on a gate or interconnect line while maintaining the thickness of the silicide layer in diffusion junctions at a maximum depth for minimum sheet resistance. In the following description, numerous specific details are set forth such as specific materials, thicknesses, processing steps, process parameters, etc. in order to provide a thorough understanding of the invention. It will be obvious, however, to one skilled in the art that these specific details need not be employed to practice the invention. In other instances, well known materials or methods have not been described in detail in order to avoid unnecessarily obscuring the invention.

Figure 1:
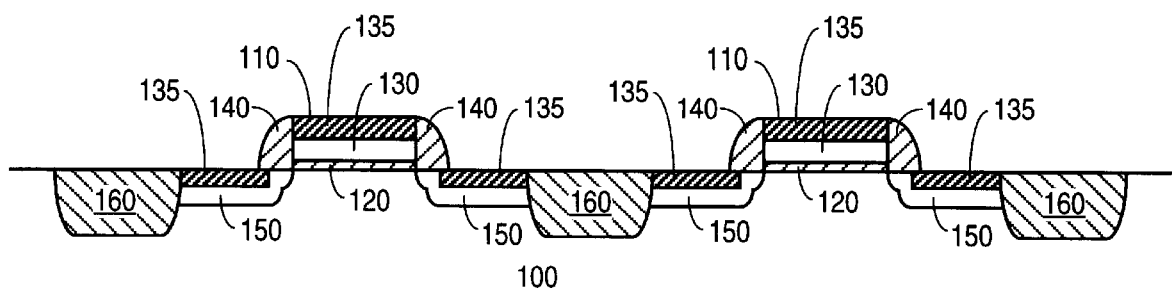
FIG. 1 is a planar side view of a portion of an integrated circuit structure.
Figure 2:
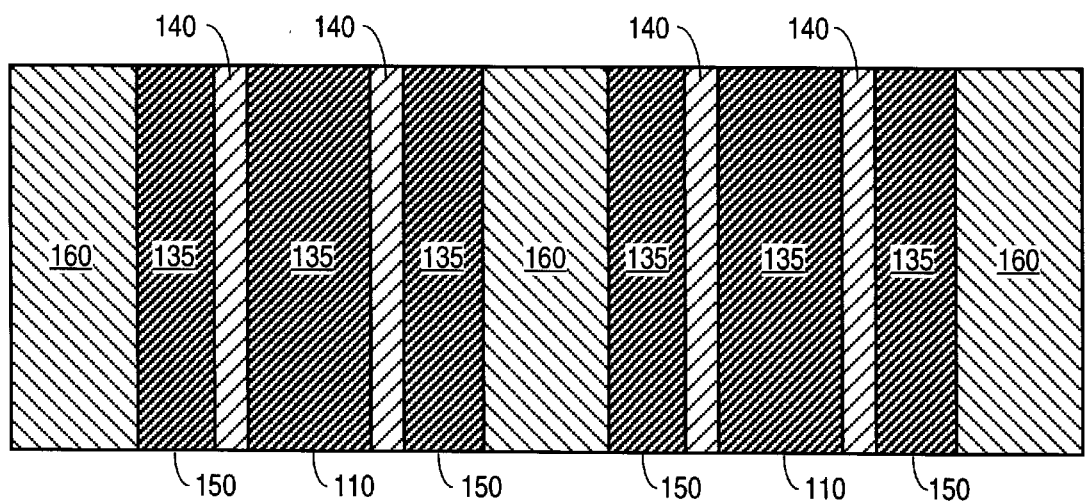
FIG. 2 is a planar top view of the portion of an integrated circuit structure of FIG. 1.
Figure 3:
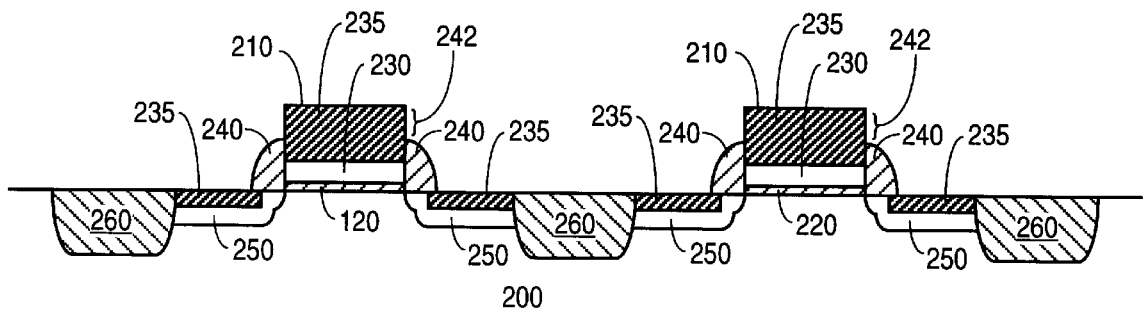
FIG. 3 illustrates a planar side view of a portion of an integrated circuit structure of the invention.

FIG. 3 presents a planar side portion of a portion of an integrated circuit structure of the invention. FIG. 3 illustrates a pair of gate structures 210 comprised of conductive layers 230 overlying gate oxides 220 overlying semiconductor substrate 200. Isolation structures 260 isolate the individual gates 210. Diffusion regions 250 are formed in the semiconductor substrate 200 adjacent to each gate.

The semiconductor substrate 200 in FIG. 3 can be either p- or n-type and includes diffusion regions 250, e.g., source/drains, that are heavily doped with the opposite dopant type of the substrate 200. The conductive layer 230 is preferably polysilicon, doped, for example, by implantation with phosphorous. The polysilicon conductive gate layer 230 overlays a gate oxide layer that is, for example, doped or undoped silicon dioxide. The gate oxide layer 220 may include a single oxide or several oxides formed by various methods. For example, one or more layers of oxide may be grown on the semiconductor substrate or deposited by plasma-enhanced chemical vapor deposition ("PECVD"), thermal CVD ("TCVD"), atmospheric pressure CVD ("APCVD"), sub-atmospheric pressure CVD ("SACVD"), for example, utilizing TEOS and oxygen or TEOS and ozone chemistries.

Silicon nitride dielectric spacers 240 are positioned along the side portion of the polysilicon conductive layer 230 and separate the conductive layer 230 from the diffusion regions 250. Silicon nitride is typically represented chemically as $Si_3N_4$ or $Si_xN_yH_z$ and is broadly represented here as $Si_xN_y$. It should be appreciated by those of ordinary skill in the art that the $Si_xN_y$ layer 240 could instead be a dielectric layer of, for example, $SiO_2$, ONO, TEOS, or $SiO_xN_y$. Additionally, the dielectric layer 240 may be undoped or may be doped, for example with boron, phosphorous, or both, for example, borophosphosilicate glass ("BPSG"), phosphosilicated glass ("PSG"), and borophosphosilicate tetraethyl orthosilicate ("BPTEOS"). Further, the dielectric spacer 240 may comprise a single dielectric layer, like $Si_xN_y$, or several layers formed by various methods.

The $Si_xN_y$ spacer portion 240 is etched away from the polysilicon conductive layer 230 such that a portion 242 of the side portions of the polysilicon conductive layer 230 are exposed. Silicide layers 235 are formed in the polysilicon layer 230 and the diffusion regions 250.

Figure 4:
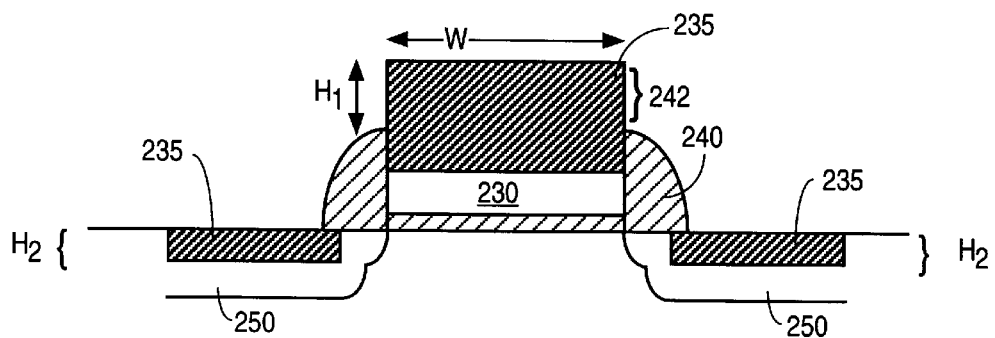
FIG. 4 illustrates a planar side view of a silicide structure of the invention.

The thickness of the silicide layers 235 in the diffusion regions or junctions 250 is equivalent to approximately one half the thickness of the junction as practiced by conventional silicide chemistry. As illustrated in FIG. 4, however, because of the exposed side portions 242 of the polysilicon conductive layer 230, the silicide layer 235 formed in the conductive layer 230 will be a thicker layer of silicide than the corresponding layer in the diffusion regions or junctions 250. This is so even though the thickness of the silicide layer 235 in the junctions 250 remains the limiting factor and depends on the amount of as-deposited metal. The exposed side portions 242 of the polysilicon offer the deposited silicide metal a route, in addition to the exposed top portion, to diffuse into the polysilicon (i.e., additional exposed Si surface area). As illustrated in FIG. 4, the result of this increased diffusion is that the thickness of the silicide layer 235 on the gate ($H_1$) is greater than the thickness of the silicide layer 235 of the diffusion region 250 ($H_2$).

The determination of the thickness of the metal silicide layer added to the device of the invention can still be governed by conventional standards, i.e., the silicide thickness in the junctions is determined by the thickness of as-deposited metal and is approximately one half the thickness of the junctions to satisfy shallow junction requirements. On the polysilicon layer 230, however, where recessed spacer portions 240 are created so that the polysilicon stands out above the $Si_xN_y$ spacers 240, the thickness of the silicide layer 235 is determined by both the thickness of as deposited metal and the effective polysilicon surface area, including top and side surfaces. A thicker silicide layer 235 on polysilicon than that in the diffusion or junction regions 250 is obtained because metal from the silicide deposited on the side surfaces of the polysilicon gate moves into the gate and contributes to the silicide layer 235. Hence, a structure with lower sheet resistance than conventional silicide structures is formed.

The invention contemplates that a novel silicide can be utilized to form the described structure. The silicide preferably utilized in the invention is one where the metal portion of the metal silicide is the dominant migrator. A conventional silicide like titanium silicide ($TiSi_2$) has a migration property such that the silicon Si moves out of the gate toward the dielectric layer as the silicide layer is formed, i.e., the Si is the dominant migrator or diffuser as the silicide layer is formed. Certain silicides, including, but not limited to, nickel silicide (NiSi) and platinum silicide (PtSi), have a property wherein the metal is the dominant migrator or diffuser. The metal of these suicides has a rate of diffusivity much higher, e.g., on the order of one hundred times higher, than the diffusivity of the silicon. For a silicide formation process where only metal diffuses, e.g., NiSi or PtSi, the underlying silicon remains intact. Thus, when the metal silicide is deposited over the gate structure with exposed side portions, the silcide layer formed in the gate structure is thicker because more of the metal adjacent the side portions moves into the polysilicon layer 230 as does the metal deposited on the top of the polysilicon layer 230. Thus, the invention exploits the property of metal diffusion by creating a recessed spacer 240 and reacting the exposed polysilicon layer 230 to a metal silicide wnere the metal is the dominant migrator.

Figure 5:
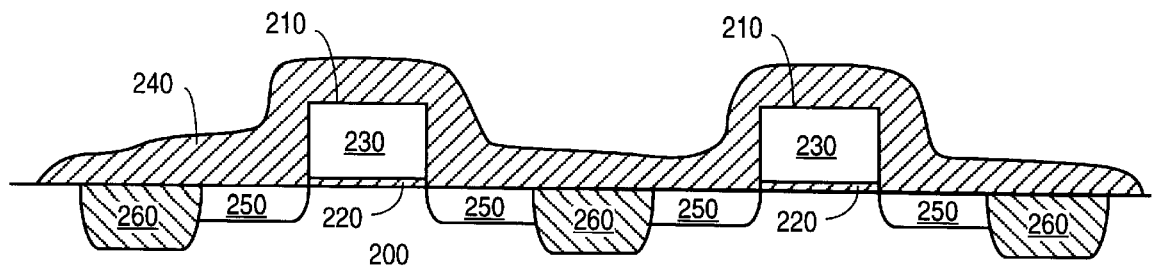
FIGS. 5–9 illustrate in planar side view portions the process of forming silicide structures on a semiconductor substrate.

FIGS. 5–9 present a method of forming the semiconductor structure of the invention. FIG. 5 shows standard MOS devices formed on semiconductor substrate 200 and include gate or interconnect conductive layers 230 that overly gate oxides 220.

The semiconductor substrate 200 can be either p- or n-type and includes an active region bounded by isolation regions 260 that are, for example, field oxide regions. The active region includes designated diffusion regions 250, such as sources and drains. First, an insulating dielectric layer 220 such as doped or undoped silicon dioxide is deposited or grown over the active region. The dielectric layer 220 may comprise a single oxide or several layers formed by various methods. For example, one or more layers of oxide may be grown or may be deposited by plasma-enhanced chemical vapor deposition ("PECVD"), thermal CVD ("TCVD"), atmospheric pressure CVD ("APCVD"), sub-atmospheric pressure CVD ("SACVD"), for example utilizing TEOS and oxygen or TEOS and ozone chemistries.

Next, a conducting layer 230 of polysilicon doped by implantation with, for example, phosphorous, is deposited over the dielectric layer. It should be appreciated by those skilled in the art that conducting layer 230 could instead be, for example, a p-type conducting layer. The polysilicon layer 230 is patterned by known lithographic techniques and then etched with, for example, a chlorine plasma (Cl$_2$/He) to define a polysilicon conducting layer or gate 230 in the active region adjacent diffusion regions.

A silicon nitride (Si$_x$N$_y$) dielectric layer 240 is then deposited in a blanket fashion over the devices and will ultimately be used to form the spacer portions along the side portions of the conductive layers 230. It should be appreciated by those of ordinary skill in the art that this Si$_x$N$_y$ layer 240 could instead be an insulating layer of, for example, silicon dioxide, ONO, TEOS, or SiO$_x$N$_y$. Additionally, the insulating layer 240 may be undoped or may be doped, for example with boron, phosphorous, or both, to form, for example, borophosphosilicate glass ("BPSG"), phosphosilicated glass ("PSG"), and borophosphosilicate tetraethyl orthosilicate ("BPTEOS"). Further, the dielectric layer 240 may comprise a single layer oxide, like silicon nitride, or several layers formed by various methods.

Figure 6:
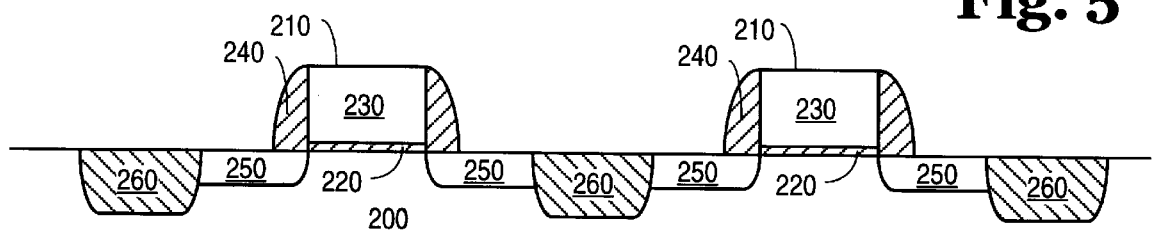

Referring to FIG. 6, the Si$_x$N$_y$ dielectric layer 240 is etched, preferably with an etchant that is selective for Si$_x$N$_y$, that is, an etchant that will etch Si$_x$N$_y$ and not etch areas of exposed silicon, for example, the gate or the source/drain regions. Such an etchant is, for example, CHF$_3$/O$_2$ using a plasma etcher. The selectivity assures that the etchant will etch only the dielectric layer 240 and will not etch the underlying polysilicon layer 230 once the polysilicon layer 230 is exposed. The etchant proceeds in a substantially vertical direction and removes the Si$_x$N$_y$ dielectric layer 240 from the device regions but leaves spacer portions 240 adjacent the conductive layer 230. The dielectric spacers 240 are etched to a thickness of, for example, approximately 500–1,000 Å.

Figure 7:
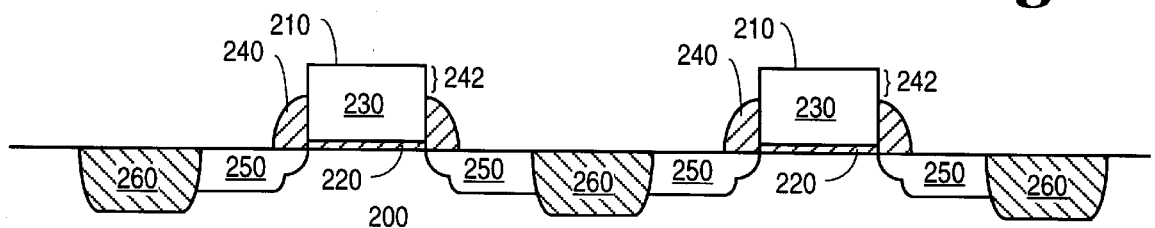

As illustrated in FIG. 7, the highly selective etch is continued to form the recessed spacer portions 240. This overetching exposes side portions 242 of the polysilicon conductive layer 230. The etch rate characteristics and the height of the conductive layer 230 will determine the time parameters of this etch.

Once the recess spacer portions 240 are formed, impurities, for example, arsenic or boron, are implanted in the diffusion regions 250 of the active region. The implanted impurities in the diffusion regions 250 are then electrically activated by a thermal annealing step. The temperature range for the thermal step for electrical activation is understood in the art and ranges from approximately 500–1,000° C. depending upon factors such as the impurity dosage, the disorder of the impurities, and the junction depth.

Figure 8:
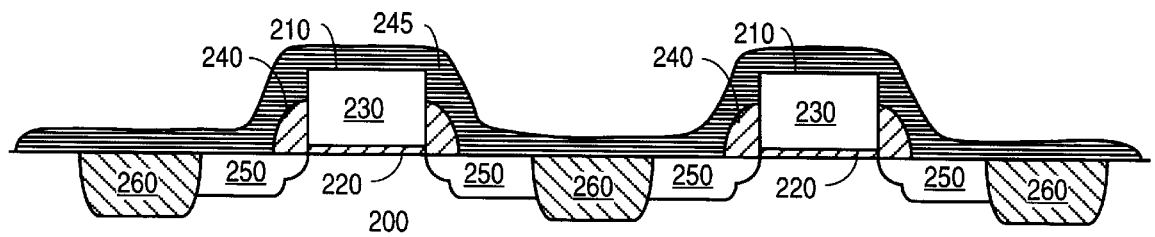

Referring to FIG. 8, silicide layers 235 are next formed in the polysilicon conductive layer 230 and the diffusion regions 250. The silicides are preferably formed by the deposition of pure metal on the silicon, i.e., onto single crystal and polycrystalline Si, followed by rapid thermal annealing to form the silicide. FIG. 8 presents the method wherein a layer of metal 245, for example Ni or Pt, is deposited over the structure.

Preferably the silicide that is to be formed is one wherein the metal portion of the silicide is the dominant diffuser or migrator during silicide layer formation. Such silicides include, but are not limited to, NiSi and PtSi. The metal component of the silicide should have a rate of diffusivity significantly higher, e.g., on the order of one hundred times, than that of the silicon component.

After the metal is deposited, the silicide is formed by an annealing step wherein the structure is heated to facilitate the reaction of the metal, for example, Ni or Pt, with the silicon to form the silicide layer 235. The formation temperature for NiSi is approximately 400–600° C. The formation temperature for PtSi is 300–500° C. The formation step may also involve a series of heating steps to gradually form the silicide structure 235 or may involve rapid thermal processing, for example, at 300–800° C. in nitrogen.

The formation step takes advantage of the diffusion properties of the deposited metal. Because a portion of the sides of the polysilicon conductive layer 230 are exposed to the deposited silicide, the formation step contemplates that the silicide layer 235 on the polysilicon conductive layer 230 will form both from the top and from the sides of the conductive layer 230. Once the layer is formed, the unreacted metal is removed by a conventional wet etch.

Figure 9:
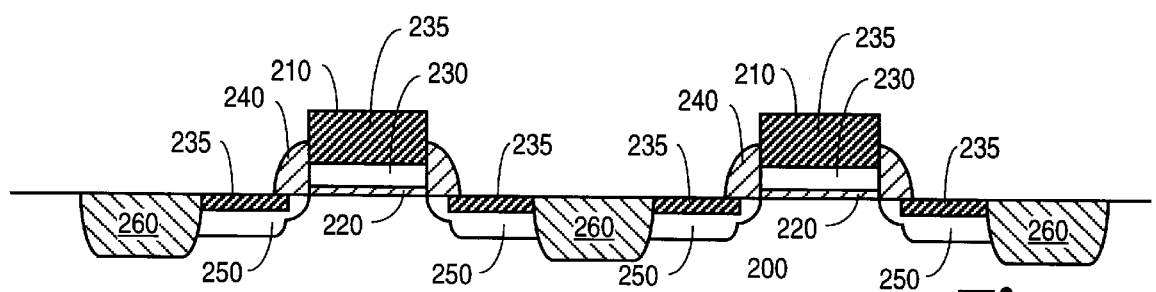

FIG. 9 illustrates the silicide layers 235 formed in the diffusion regions 250 and on the polysilicon conductive layer 230. The thickness of the silicide layer 235 is determined by conventional means, for example, one half the thickness of the diffusion region junctions. For example, for a diffusion region junction of 1,000 Å, the silicide layer 235 in the diffusion regions 250 will be approximately 500 Å thick.

The process described above yields a structure, illustrated in FIG. 9, wherein the silicide layer 235 on the polysilicon conductive layer 230 is substantially thicker than the silicide layer 235 in the diffusion regions 250. This silicide process solves the problem of conflicting requirements for shallow junctions and lower sheet resistance on polysilicon as transistors shrink to sub-quarter micron. It has further been determined that the thickness multiplier between silicide layers 235 on the polysilicon layer 230 and the source/drain regions 250 increases as the line width decreases by the following formula:

$$M=1+2h/w$$

where h is the height of the side portion of the conductive layer above the spacer 240 and w is the width of the conductive layer 230. For a 0.1μ gate length transistor, M is 2 for a recessed height of 50 nm. In other words, the silicide layer 235 on the polysilicon conductive layer is twice as thick than that in the diffusion region 250. As is evident by the above formula, as the line width of the polysilicon conductive layer decreases, the multiplier increases, and the thickness of the silicide layer relative to the diffusion regions on the polysilicon becomes larger. Thus, the resistivity properties provided by the silicide layer are maintained or improved for smaller transistors with narrower junctions.

The invention allows the silicide layers in the diffusion regions to be compatible with shallow junction requirements but creates a thicker silicide layer on the conductive layer 230 to achieve lower resistance. The resistance is inversely proportional to the thickness of the silicide layer and determines the length of the polysilicon layer lines as well as the RC delay. FIG. 10 presents a graph of the sheet resistance of a NiSi film versus polysilicon line width. The graph shows that the resistance decreases from approximately 5 ohms/sq to about 3.5 ohm/sq as the polysilicon line width decreases from one micron to 150 nm. This is caused by the increase NiSi thickness on the polysilicon as described above with reference to the silicide process utilizing the recessed spacers.

In the preceding detailed description, the invention is described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A semiconductor device comprising:
   a conductive layer with opposing side portions over an active area of a semiconductor substrate, a portion of said conductive layer having a metal silicide layer;
   a dielectric spacer adjacent to less than the entire portion of a side portion of said conductive layer; and
   a diffusion region in said semiconductor substrate and adjacent said conductive layer, a portion of said diffusion region having a metal silicide layer, the thickness of said metal silicide layer of said diffusion region being less than the thickness of said metal silicide layer of said conductive layer.

2. The semiconductor device of claim 1, wherein said metal silicide layer is comprised of one of NiSi and PtSi.

3. A transistor comprising a gate with opposing side portions over an active area of a semiconductor substrate, wherein a top portion of said gate includes a metal silicide layer;
   a dielectric spacer adjacent to less than the entire portion of a side portion of said gate; and
   source and drain regions in said semiconductor substrate and adjacent said gate, wherein a portion of said source region and a portion of said drain region each include a metal silicide layer, the thickness of said metal silicide layer of each of said source region and said drain region being less than the thickness of said metal silicide layer of said gate.

* * * * *

UNITED STATES PATENT AND TRADEMARK OFFICE
CERTIFICATE OF CORRECTION

PATENT NO. : 5,889,331
DATED : March 30, 1999
INVENTOR(S) : Bai

It is certified that error appears in the above-identified patent and that said Letters Patent is hereby corrected as shown below:

<u>Column 4,</u>
Line 60, replace "silicide" with -- salicide --.

<u>Column 5,</u>
Line 5, replace "suicide" with -- silicides --.
Line 17, replace "wnere" with -- where --.

Signed and Sealed this

Eighth Day of January, 2002

Attest:

JAMES E. ROGAN
*Attesting Officer*     *Director of the United States Patent and Trademark Office*